United States Patent
May

(10) Patent No.: US 7,202,752 B2
(45) Date of Patent: Apr. 10, 2007

(54) CONTROLLABLE PHASE LOCKED LOOP WITH OUTPUT OSCILLATION ADJUSTMENT AND METHOD FOR PRODUCING AN OUTPUT OSCILLATION FOR USE THEREWITH

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 104 days.

(21) Appl. No.: 11/126,553

(22) Filed: May 11, 2005

(65) Prior Publication Data

US 2006/0255867 A1 Nov. 16, 2006

(51) Int. Cl.
*H03L 7/099* (2006.01)
*H03L 7/16* (2006.01)
*H03L 7/18* (2006.01)

(52) U.S. Cl. .............................. 331/34; 331/16; 331/25; 331/57; 455/260

(58) Field of Classification Search ................ 331/1 A, 331/16–18, 25, 34, 57; 327/156–159; 375/376; 455/260
See application file for complete search history.

(56) References Cited

U.S. PATENT DOCUMENTS

| | | | | |
|---|---|---|---|---|
| 5,059,924 A | * | 10/1991 | JenningsCheck | ............ 331/1 A |
| 5,394,116 A | * | 2/1995 | Kasturia | ...................... 331/34 |

OTHER PUBLICATIONS

Chan-Hong Park, et al; A 1.8-GHz Self-Calibrated Phase-Locked Loop with Precise I/Q Matching; IEEE Journal of Solid-State Circuits, vol. 36, No. 5, May 2001; p. 777-783.

* cited by examiner

*Primary Examiner*—David Mis
(74) *Attorney, Agent, or Firm*—Garlick Harrison & Markison; Bruce E. Stuckman

(57) ABSTRACT

A phase locked loop circuit is implemented with difference detection module that produces a difference signal based on at least one of phase difference and frequency difference between a reference oscillation and a feedback oscillation. A loop filter module converts the difference signal into a control signal. A controlled oscillation module converts the control signal into an output oscillation. An output oscillation adjust module, coupled to the controlled oscillation module, produces an effective output oscillation based on an oscillation control signal. A divider module converts the effective output oscillation into the feedback oscillation.

34 Claims, 8 Drawing Sheets

CONTROLLABLE PHASE LOCKED LOOP WITH OUTPUT OSCILLATION ADJUSTMENT AND METHOD FOR PRODUCING AN OUTPUT OSCILLATION FOR USE THEREWITH

TECHNICAL FIELD OF THE INVENTION

The present invention relates to oscillators, phase locked loop circuits and related methods.

DESCRIPTION OF RELATED ART

Phase locked loop circuits are employed in applications such as radio receivers for demodulating frequency and phase modulated radio signals and further in the design of local oscillators used for demodulating radio signals. One concern in the design of these circuits is the amount of noise that is produced. When implemented in a radio receiver, it is desirable for the output noise of these circuits to be as low as possible. Digital circuit designs can reduce the amount of analog noise, such as thermal noise that is introduced. However, digital circuits produce a certain amount phase/frequency jitter that is recognized as noise on the output.

Prior art designs have utilized inductors for increasing the oscillation frequency of the voltage controlled oscillator (VCO) in order to accomplish a low jitter. One method to produce a high frequency VCO includes the use of inductors. However, it is often desirable to implement phase locked loop circuitry in an integrated circuit (IC). While inductive elements can be implemented in an IC, these circuit elements require a great deal of space on the IC that either necessitate the design of larger chips or of reduced space for other circuit components. In addition, greater VCO oscillation frequencies require larger dividers that consume more power.

Prior art phase locked loop circuits have employing fractional dividers to provide a greater control over output frequencies. However, these circuits also introduce phase/frequency jitter that is recognized as noise on the output.

The need exists for a low noise phase locked loop circuit that can be implemented efficiently on an IC. The need further exists for a phase locked loop circuit that can be quickly and accurately adjusted to an output frequency.

DETAILED DESCRIPTION OF THE INVENTION INCLUDING THE PRESENTLY PREFERRED EMBODIMENTS

The embodiments of the present invention yield several advantages over the prior art. In an embodiment, fine adjustments of the output frequency of a phase locked loop can be accomplished by adjusting a time delay of the output oscillation in order to form an effective output oscillation that is used in the feedback loop. In a further embodiment, a ring oscillator that includes a plurality of buffer stages with a corresponding plurality of taps is used to implement the VCO. In this embodiment, the delay of each buffer is used to generate adjustments to the output frequency. In this fashion, finer frequency adjustments are possible in an inductorless design.

Figure 1:
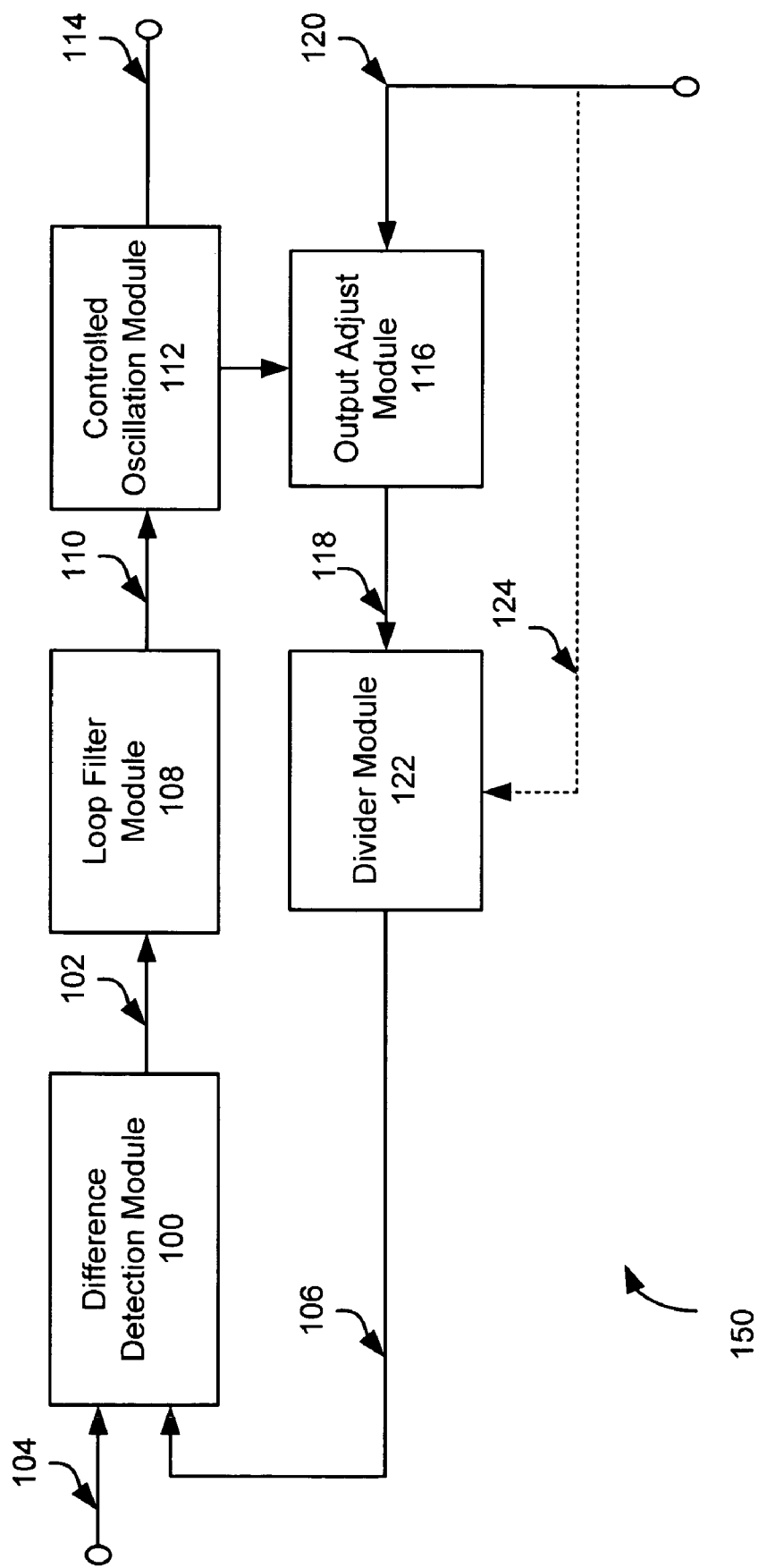
FIG. 1 presents a block diagram representation of a phase locked loop in accordance with an embodiment of the present invention.

FIG. 1 presents a block diagram representation of a phase locked loop in accordance with an embodiment of the present invention. In particular, a phase locked loop circuit 150 is implemented with difference detection module 100 operably coupled to determine a difference signal 102 based on at least one of a phase difference and a frequency difference between a reference oscillation 104 and a feedback oscillation 106. A loop filter module 108 is operably coupled to convert the difference signal 102 into a control signal 110. A controlled oscillation module 112 is operably coupled to convert the control signal 110 into an output oscillation 114. An output oscillation adjust module 116 is operably coupled to the controlled oscillation module 112 to produce an effective output oscillation 118 based on an oscillation control signal 120. A divider module 122 is operably coupled to convert the effective output oscillation 118 into the feedback oscillation 106.

In an embodiment of the present invention, divider module 112 can be a fixed divider that produces feedback oscillation 106 by dividing the frequency of effective output oscillation 118 by a constant value. In other embodiments of the present invention, divider module 122 is responsive to oscillation control signal 120, via optional connection 124, to divide the effective oscillation output 118 by a selected divisor.

In accordance with an embodiment of the present invention, the difference detection module 100 is implemented with a phase sensitive detector whose output current is proportional to the difference in phase between the feedback oscillation 106 and the reference oscillation 104. Loop filter module 108 includes an RC series connection to ground with the voltage across the RC series combination providing control signal 110 that is coupled to controlled oscillation module 112. In this embodiment, the control signal 110 is a scaled version of the the difference signal 102 plus a scaled and integrated version of the difference signal 102. In accordance with an embodiment of the present invention, controlled oscillation module 112 includes a voltage controlled oscillator that produces output oscillation 114 with an output frequency that is responsive to the voltage of control signal 110 from the loop filter module 108. In a preferred embodiment of the present invention, difference detection module 100 and loop filter module 108 are implemented by digital circuits, however, analog circuit implementations are likewise possible as will be understood by one of ordinary skill in the art.

In accordance with an embodiment of the present invention, output oscillation adjust module 116 modifies the output oscillation 114 by periodically adjusting the output oscillation frequency. In one embodiment of the present invention, the output oscillation adjust module periodically adjusts the period of oscillation, by subtracting or adding a time delay to the output oscillation 114.

In operation, the phase locked loop operates to lock the frequency of the feedback oscillation 106 to the frequency of the reference oscillation 104. The frequency division of divider module 122 provides a change in frequency by a divisor N, which is either a constant value or a selected divisor value that is chosen based on the oscillation control signal 120. The frequency of the effective output oscillation 118, $F_{eo}$ can therefore be represented in terms of the frequency of the feedback oscillation 106, as:

$$F_{eo} = NF_{fb}$$

Because the frequency of the feedback oscillation 106 is locked to the frequency of the reference oscillation 104, $F_{ref}$, $$F_{eo} = NF_{ref}$$

In an embodiment of the present invention, divider module N is implemented using counters, shift registers and/or D flip-flops and divisor N is an integer value. However, in accordance with an alternative embodiment, divider module 122 can be implemented using a fractional divider as will be understood by one skilled in the art based on the teachings described herein. In this alternative embodiment, N takes on a real number that includes a fractional component.

In an embodiment, the effective output oscillation 118 is formed by periodically advancing the output oscillation 114 by a time period $T_{adv}$. In this case, the effective output oscillation frequency $F_{eo}$ is greater than the output oscillation frequency. Further, in a preferred embodiment, the time period of the adjustment is relatively small in comparison with the time period of the output oscillation 114 and in particular, $$(F_{eo} - F_o)/F_0 < 0.5.$$

In an alternative embodiment, the output oscillation adjust module 116 can either add or subtract a time delay to the output oscillation 114. In this embodiment, $$|F_{eo} - F_o|/F_o < 0.5$$

Figure 2:
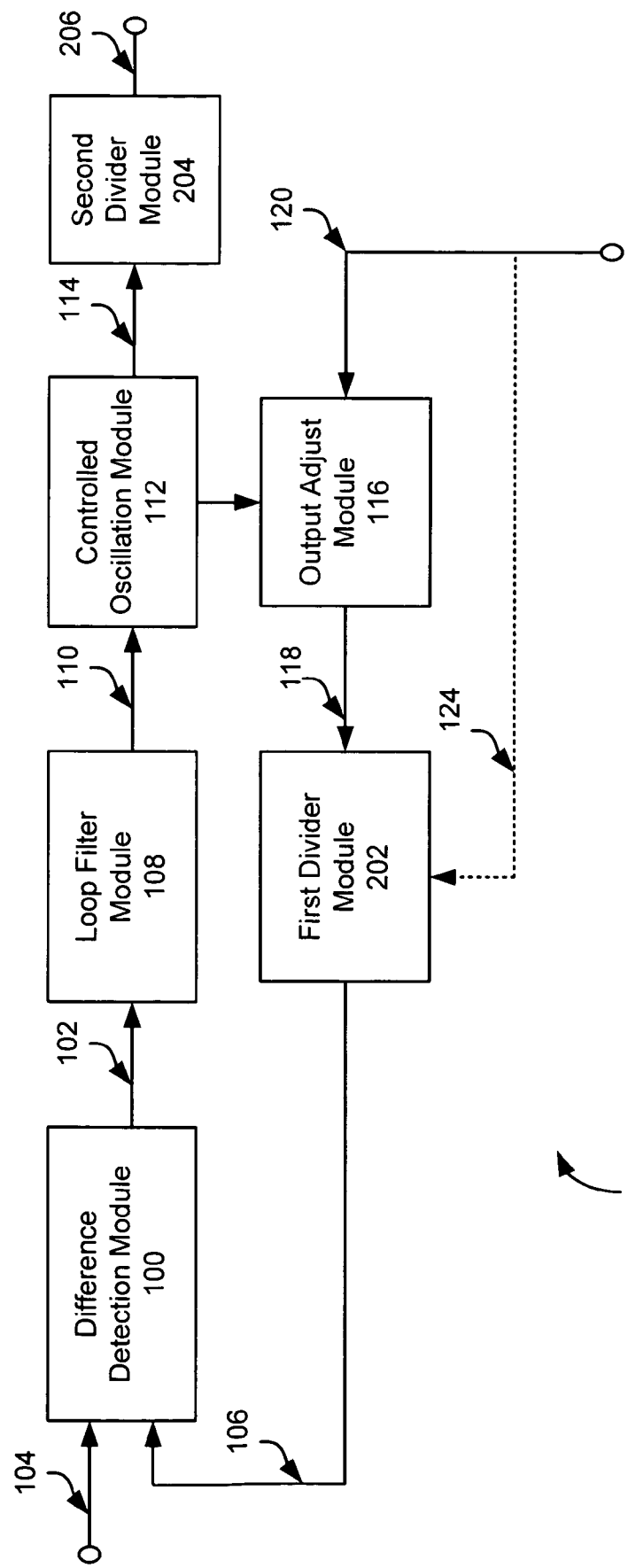
FIG. 2 presents a block diagram representation of a phase locked loop in accordance with a further embodiment of the present invention.

FIG. 2 presents a block diagram representation of a phase locked loop in accordance with a further embodiment of the present invention. In particular, an alternative embodiment of phase locked loop 150 is presented. Like components from FIG. 1 are represented by common reference numerals. A second divider module 204 further divides the output oscillation 114 by a divisor M to produce a divided output oscillation 206.

Figure 3:
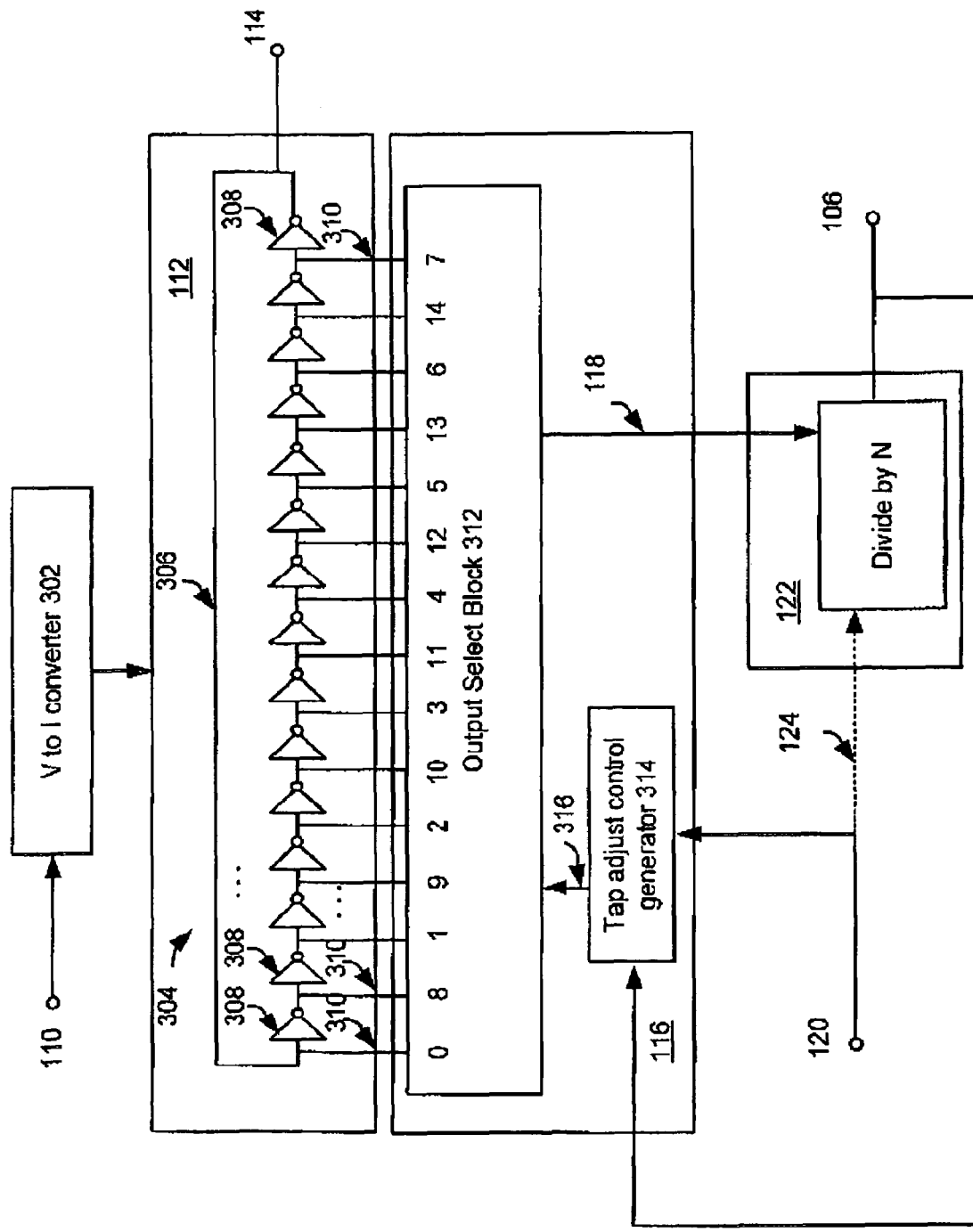
FIG. 3 presents a block diagram representation of a controlled oscillation module in accordance with an embodiment of the present invention.

FIG. 3 presents a block diagram representation of a controlled oscillation module in accordance with an embodiment of the present invention. In particular, one possible implementation is presented for controlled oscillation module 112, output adjust module 116, and divider module 122 and delay adjust module 200. In this implementation, controlled oscillation module 112 includes a voltage controlled oscillator that includes a V to I converter 302 for converting the control voltage into a current signal of ring oscillator 304. In a preferred embodiment, ring oscillator 304 is a current controlled oscillator having a plurality of buffer stages 308, a feedback loop 306 and a plurality of taps 310 coupled to a corresponding plurality of outputs of the plurality of buffer stages. In the implementation shown, 15 inverting buffer stages 308 are included. However, other implementations may include any odd number of invertors in conjunction with any number of non-inverting buffer stages. In an embodiment where loop filter module 108 is implemented using a digital filter, control output 110 is a digital signal and V to I converter 302 includes a digital to analog converter, converting the digital control signal into an analog current signal for controlling the frequency of ring oscillator 304.

Output oscillation adjust module 116 includes an output select block 312, operably coupled to the plurality of taps 310 of ring oscillator 304, for producing the effective output oscillation 118 from one of the plurality of taps 310. Output oscillation adjust module 116 further includes a tap adjust control generator 314, responsive to the oscillation control signal 120 for generating a sequence of tap adjust control signals 316 that command the output select block to select a corresponding sequence of selected taps from the plurality of taps. In a preferred embodiment, output select block 312 is implemented using a digital multiplexer circuit whose output is a selected one of the plurality of inputs. In accordance with a preferred embodiment, output select block 312 receives a 4-bit control input 316. The inputs 0–14 correspond to alternating tap outputs as shown in FIG. 3. Given that the buffers stages 308 are implemented using invertors, this produces an output for taps 0–7 that are in-phase and an output for taps 8–14 whose phase is inverted.

In a preferred embodiment of the present invention, the divider module 122 includes a controllable divide by N circuit that divides the effective output oscillation 118 by a selected divisor N, where N is an integer in the range from 48–79, and where N is selected based on a 5-bit input from oscillation control signal 120. One of ordinary skill in the art will recognize, based on the teachings of the present invention, that other ranges of N could likewise be implemented. In an alternative embodiment described in conjunction with FIG. 1, wherein N is a real number that includes a fractional component, oscillation control signal 120 includes a larger number of bits to represent a greater selection of mixed numbers including both integer and fractional components.

In an embodiment of the present invention, the effective output oscillation 118 is formed by periodically advancing the output oscillation 114 by a time period $T_{adv}$, using the output select block 312 to shift the selected tap 310. Assuming that each of the buffer stages 308 have a corresponding delay d, a shift of the output forward y taps creates an effective output oscillation 118 which is advanced in time from output oscillation 114 by an amount:

$$T_{adv} = yd$$

Consider the operation of these components in light of an illustrative example. Consider a reference frequency, $F_{ref}$=12 Mhz and consider a desired output frequency, $F_o$=608 MHz. Also consider a ring oscillator with 15 buffer stages and 15 corresponding taps. Selecting a divisor N=51 comes close to the required output frequency, $F_{eo}$=$NF_{ref}$=51 (12 Mhz)=612 MHz. However, a divisor of 50 ⅔ is what is actually required. A divisor N=51 can be used if the output frequency can be slightly adjusted, by advancing the period of ring oscillator, $T_{ro}$ by ⅓ of an output frequency period, for each period of the reference frequency. Because the delay of each tap d, is equal to $$d = T_{ro}/2(\text{the number of taps}) = T_{ro}/30$$

Periodically advancing the tap selection by (10 taps)/(30 taps) provides a ⅓ period advance that creates a effective output oscillation frequency of 612 MHz from the 608 MHz output oscillation 114. In this example, oscillation control signals serves to select a divisor of 51 for divider module 122 and further selects a period tap advance of 10 taps. Tap adjust control generator 314 then generates corresponding sequence of tap adjust control signals to implement this advance.

Figure 4:
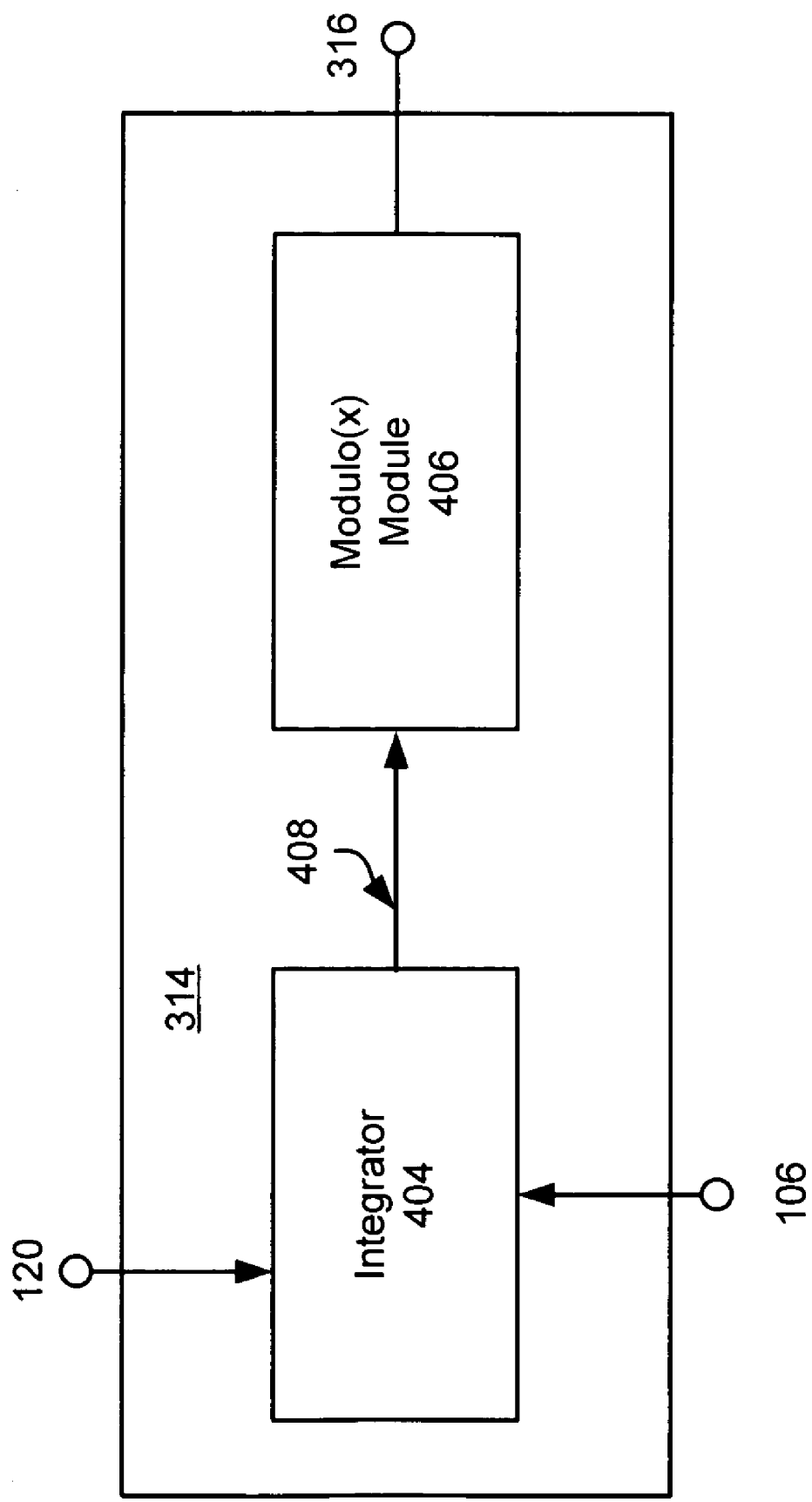
FIG. 4 presents a block diagram representation of a tap adjust control generator in accordance with an embodiment of the present invention.

FIG. 4 presents a block diagram representation of a tap adjust control generator in accordance with an embodiment of the present invention. A particular implementation of the tap adjust control generator 314 is presented. In a preferred embodiment, tap adjust control generator 314 includes an integrator 404 having an integrator output 408, responsive to the oscillation control signal 120 and the feedback oscillation 106, and a modulo(x) module 406 for producing the sequence of tap adjust signals based on the integrator output. In an alternative embodiment, reference oscillation 104 replaces feedback oscillation 106 as an input to tap adjust control generator 314. In a preferred embodiment, the value x is chosen as the number of taps in ring oscillator 304. Considering again the example discussed in conjunction with FIG. 3, an oscillation control signal 120 corresponding to a 10 tap advance is integrated by integrator 404 (an input of −10, because the input is advanced in time) that is clocked at reference oscillation 104. In this circumstance, the output 408 is the following sequence:

−10, −20, −30, −40, −50, −60, −70, −80, −90, . . .

When processed by modulo(x) module 406, where x=15, the sequence of tap adjust control signals 316 becomes:

5, 10, 0, 5, 10, 0, 5, 10, 0, . . .

In terms of the 4-bit digital output, the sequence of tap adjust control signals 316 becomes:

0101, 1010, 0000, 0101, 1010, 0000, 0101, 1010, 0000, . . .

Figure 5:
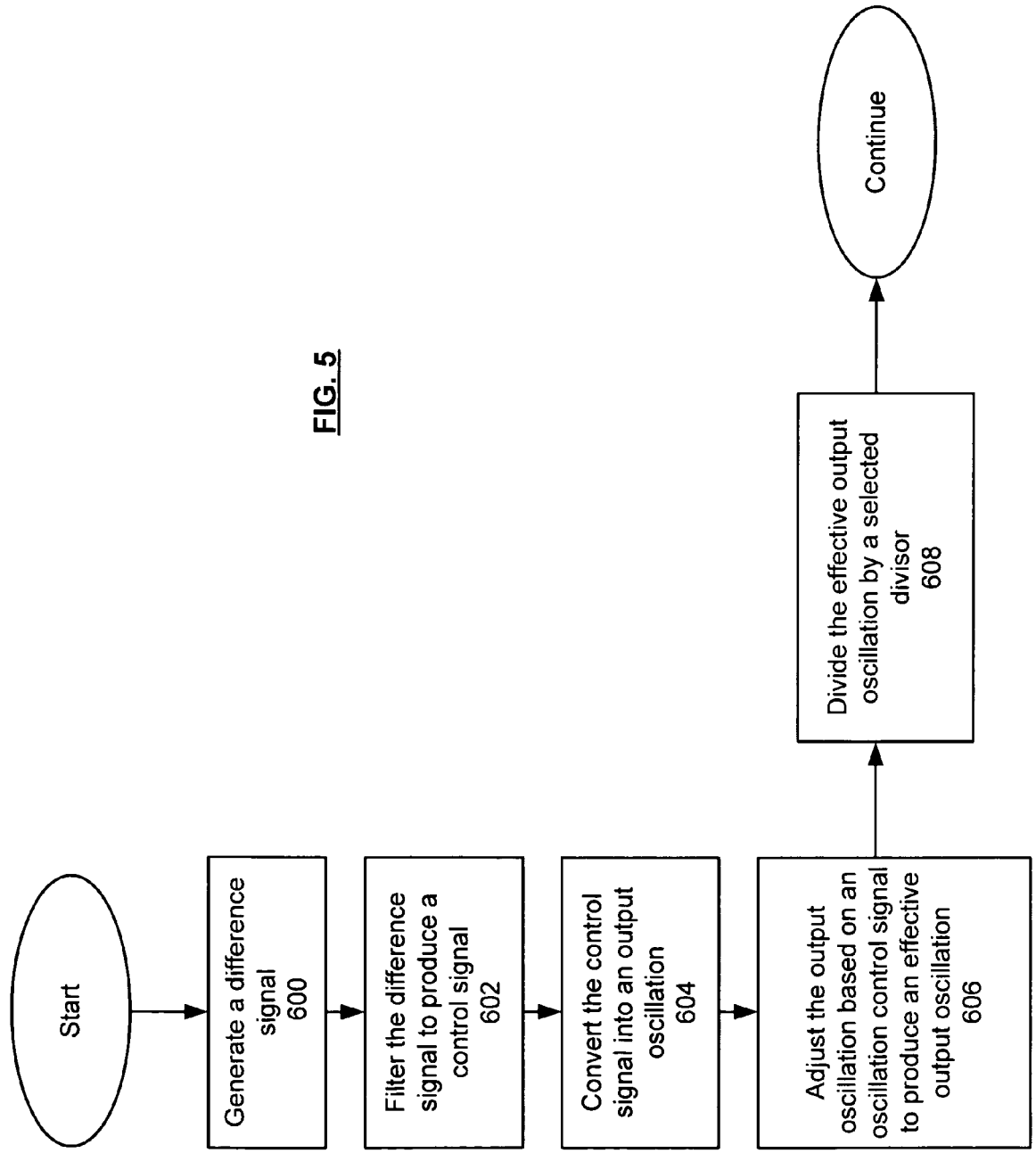
FIG. 5 presents a flowchart representation of a method in accordance with an embodiment of the present invention.

FIG. 5 presents a flowchart representation of a method in accordance with an embodiment of the present invention. In particular, the foregoing method can be implemented in conjunction with various embodiments of the present invention discussed herein, particularly in association with FIGS. 1–4, and 7–9. The method begins in step 600 by generating a difference signal based on at least one of a phase difference and a frequency difference between a reference oscillation and a feedback oscillation. In step 602 the method proceeds by filtering the difference signal to produce a control signal. In step 604, the control signal is converted into an output oscillation using a controlled oscillation module, such as controlled oscillation module 112 as described in its various forms. The method continues in step 606 adjusting the output oscillation to produce an effective output oscillation based on an oscillation control signal, and in step 608, by dividing the effective output oscillation by a selected divisor to produce the feedback oscillation.

Figure 6:
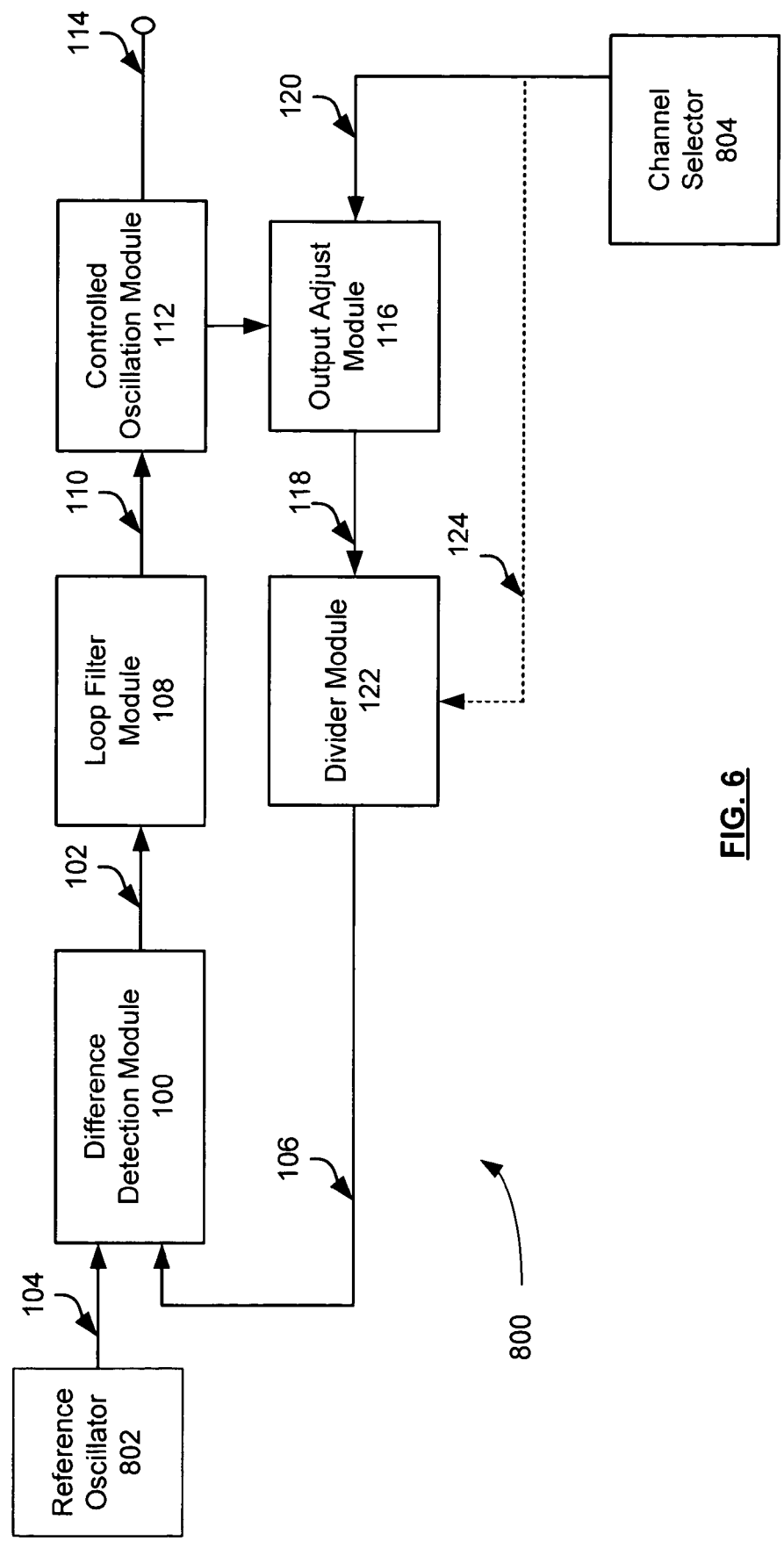
FIG. 6 presents a block diagram of a local oscillator in accordance with an embodiment of the present invention.

FIG. 6 presents a block diagram of a local oscillator in accordance with an embodiment of the present invention. In particular, a local oscillator 800 is presented for use in a radio receiver that decodes a radio signal, carrying a plurality of audio channels, into an audio output signal corresponding to a selected one of the plurality of audio channels. The local oscillator includes a reference oscillator 802 for producing a reference oscillation 104. The local oscillator further includes a channel selector 804 for generating an oscillation control signal 120 that corresponds to the selected one of the plurality of audio channels. The local oscillator further includes phase locked loop and/or methods of the present invention as implemented in one or more embodiments presented herein in association with FIGS. 1–5.

Figure 7:
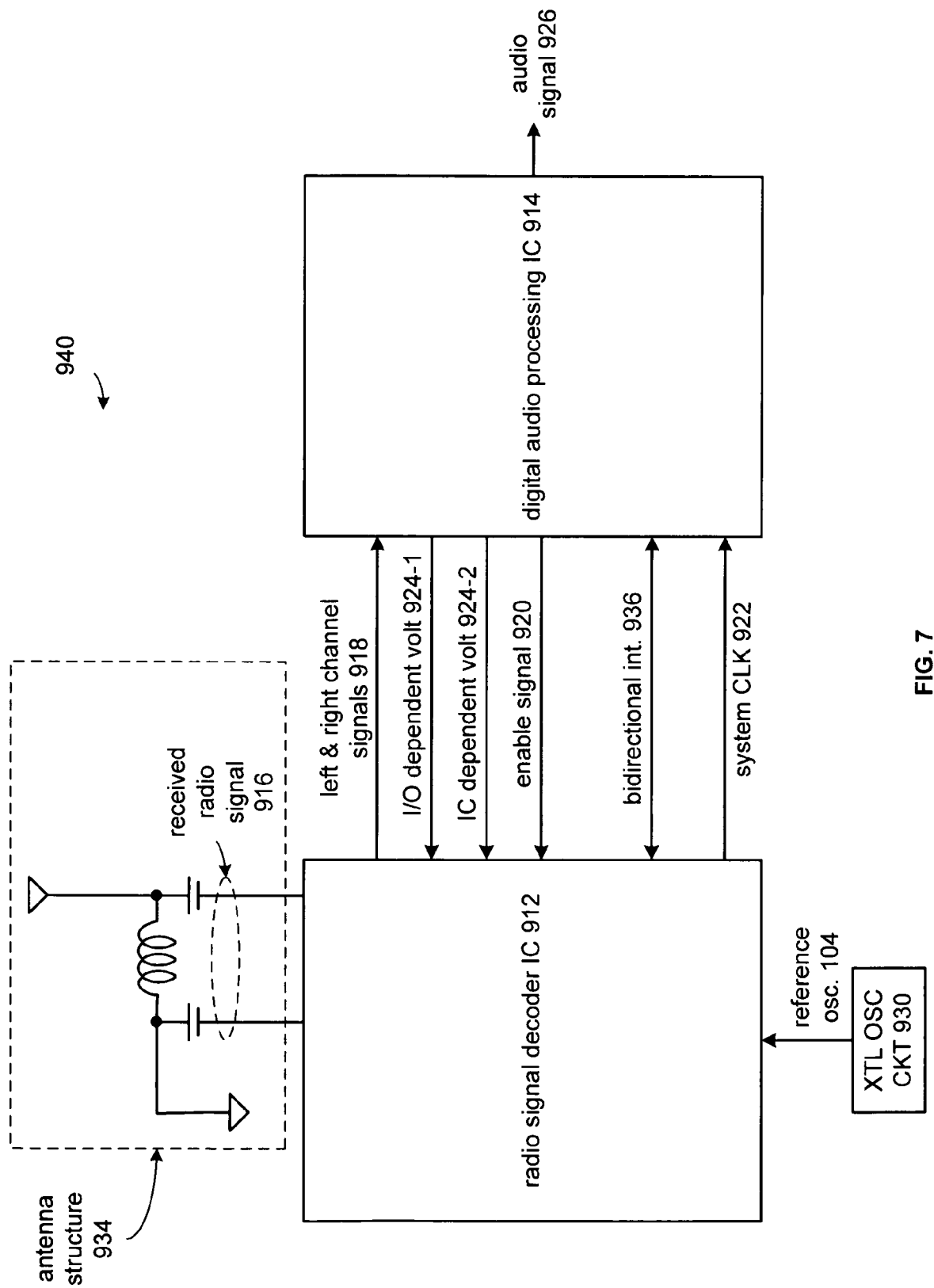
FIG. 7 presents a schematic block diagram of a handheld audio system in accordance with an embodiment of the present invention.

FIG. 7 presents a schematic block diagram of a handheld audio system in accordance with an embodiment of the present invention. In particular, handheld audio system 940 is presented that includes a radio signal decoder integrated circuit 912 and a digital audio processing integrated circuit 914. In this embodiment, the radio signal decoder integrated circuit 912 is operably coupled to a crystal oscillator circuit 930 and an antenna structure 934. The crystal oscillation circuit 930 is operably coupled to a crystal and produces therefrom a reference oscillation 104. The radio signal decoder integrated circuit 912, includes one or more phase locked loops 150 to implement at least one of a local oscillator, IF oscillator, radio receiver, and a frequency converter.

The antenna structure 934 includes an antenna, a plurality of capacitors and an inductor coupled as shown. The receive radio signal 916 is provided from the antenna structure 934 to the radio signal decoder integrated circuit 912. The radio signal decoder integrated circuit 912 converts the receive radio signal 916 into left and right channel signals 918.

The digital audio processing integrated circuit 914, via a DC-DC converter, generates an input/output (I/O) dependent supply voltage 924-1 and an integrated circuit (IC) dependent voltage 924-2 that are supplied to the radio signal decoder IC 912. In one embodiment, the I/O dependent voltage 924-1 is dependent on the supply voltage required for input/output interfacing of the radio signal decoder IC and/or the digital audio processing IC 914 (e.g., 3.3 volts) and the IC dependent voltage 924-2 is dependent on the IC process technology used to produce integrated circuits 912 and 914.

The interface between the integrated circuits 912 and 914 further includes a bi-directional interface 936. Such an interface may be a serial interface for the integrated circuits 912 and 914 to exchange control data and/or other type of data. In one embodiment, the bi-directional interface 36 may be one or more serial communication paths that are in accordance with the I²C serial transmission protocol. As one or ordinary skill in the art will appreciate, other serial transmission protocols may be used for the bi-directional interface 936 and the bi-directional interface 936 may include one or more serial transmission paths.

Figure 8:
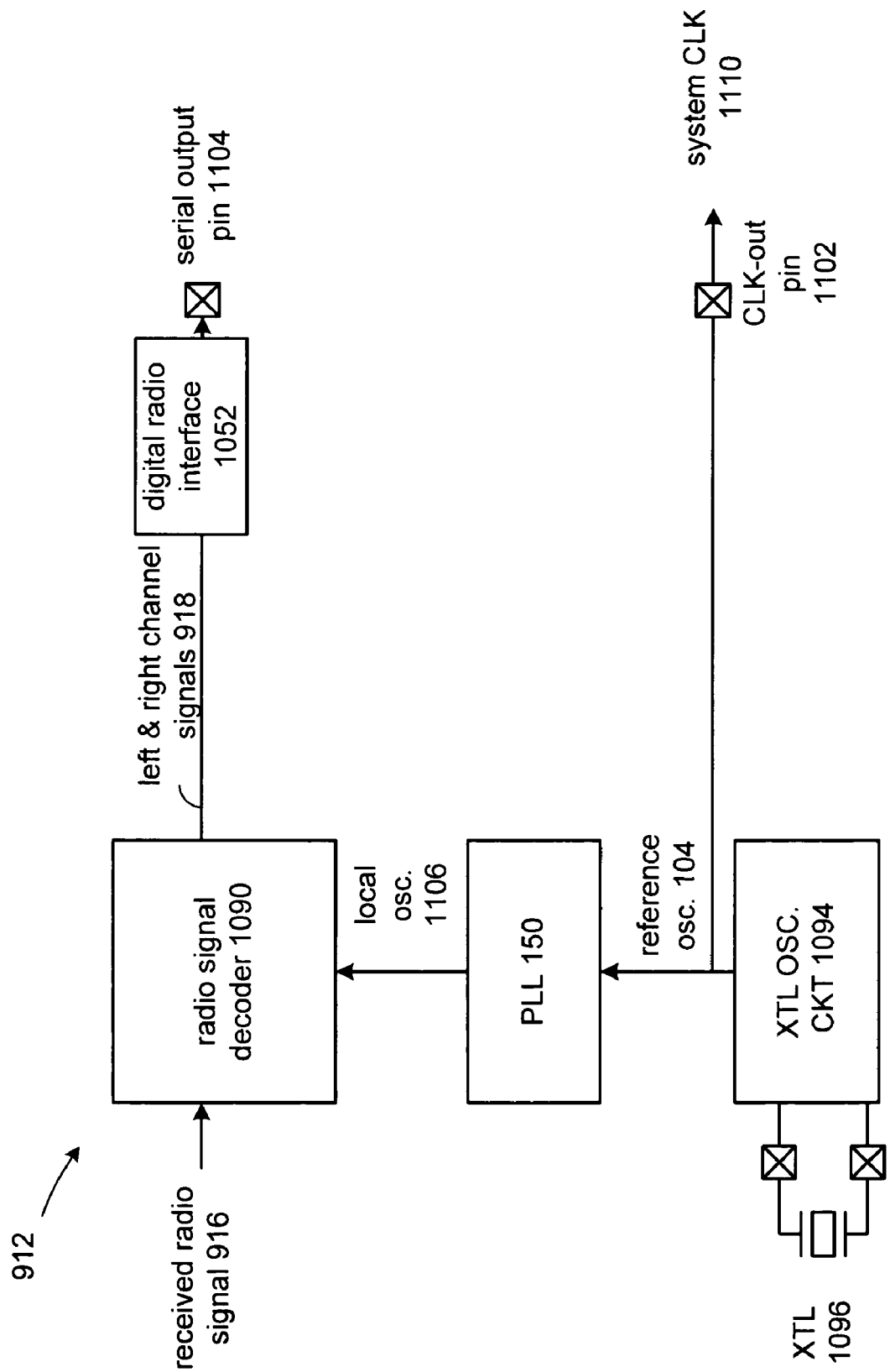
FIG. 8 presents a schematic block diagram of a radio signal decoder in accordance with an embodiment of the present invention.

FIG. 8 presents a schematic block diagram of a radio signal decoder in accordance with an embodiment of the present invention. In particular, an implementation of embodiment of the radio signal decoder integrated circuit 912 is presented that includes the digital radio interface 1052, a crystal oscillation circuit (XTL OSC CKT) 1094, a phase locked loop (PLL) 150 and a radio signal decoder 1090. The crystal oscillation circuit 1094 is operably coupled, via integrated circuit pins, to an external crystal 1096 to produce a reference oscillation 104. The rate of the reference oscillation 104 is based on the properties of the external crystal 1096 and, as such, may range from a few kilo-Hertz to hundreds of mega-Hertz. In this embodiment, the reference oscillation 104 produces the system output clock 1110, which is outputted via a clock output (CLK_out) pin 1102. As one of ordinary skill in the art will appreciate, the system clock 1110 may be identical to the reference oscillation 104, may have a rate that is a multiple of reference oscillation 104, may have a rate that is a fraction of reference oscillation 104, may have a phase shift with respect to the reference oscillation, or a combination thereof.

The phase locked loop 150 produces a local oscillation 1106 from the reference oscillation 104. The rate of the local oscillation corresponds to a difference between an intermediate frequency (IF) and a carrier frequency of the received radio signal 916. For instance, if the desired IF is 2 MHz and the carrier frequency of the received radio signal 916 is 101.5 MHz, the local oscillation is 99.5 MHz (i.e., 101.5 MHz–2 MHz). As one of ordinary skill in the art will appreciate, the intermediate frequency may range from DC to a few tens of MHz and the carrier frequency of the received radio signal 916 is dependent upon the particular type of radio signal (e.g., AM, FM, satellite, cable, etc.).

The radio signal decoder 1090 converts the received radio signal 916, which may be an AM radio signal, FM radio signal, satellite radio signal, cable radio signal, into the left and right channel signals 918 in accordance with the local oscillation 1106. The radio signal decoder 1090 provides the left and right channel signals to the digital radio interface 1052 for outputting via a serial output pin 1104. The serial output pin 1104 may include one or more serial input/output connections.

In preferred embodiments, the various circuit components of the phase locked loop circuit 150 and other circuits are implemented using 0.08 to 0.35 micron CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a phase locked loop and a radio receiver. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A phase locked loop comprising:
a difference detection module operably coupled to determine
a difference signal based on at least one of a phase difference and a frequency difference between a reference oscillation and a feedback oscillation;
a loop filter module operably coupled to convert the difference signal into a control signal;
a ring oscillator having a plurality of buffer stages and a plurality to taps coupled to a corresponding plurality of outputs of the plurality of buffer stages, the ring oscillator operably coupled to convert the control signal into an output oscillation;
an output oscillation adjust module operably coupled to the ring oscillator for producing an effective output oscillation based on an oscillation control signal, wherein the output oscillation adjust module includes an output select block, operably coupled to the plurality of taps, for producing the effective output oscillation from a sequence of selected taps from the plurality of taps, and a tap adjust control generator, responsive to the oscillation control signal for generating a sequence of tap adjust control signals that command the output select block to select the sequence of selected taps from the plurality of taps; and
a divider module operably coupled to convert the effective output oscillation into the feedback oscillation;
wherein the effective output oscillation has a frequency $F_{eo}$ and the output oscillation has a frequency $F_o$ and wherein $|F_{eo}-F_o|/F_o <0.5$;
wherein the divider module is responsive to the oscillation control signal to produce the feedback oscillation by dividing the frequency of the effective output oscillation $F_{eo}$ by a selected divisor.

2. The phase locked loop of claim 1 wherein the tap adjust control generator includes an integrator having an integrator output, responsive to the oscillation control signal and a modulo(x) module for producing the sequence of tap adjust control signals based on the integrator output, wherein the value of x is equal to the number of the plurality of taps.

3. The phase locked loop of claim 1 wherein the divider module includes a fractional divider.

4. The phase locked loop of claim 1 wherein the effective output oscillation has a frequency $_{eo}$ and the output oscillation has a frequency $F_o$ and wherein $F_{eo} >F_o$.

5. A phase locked loop comprising:
a difference detection module operably coupled to determine a difference signal) based on at least one of a phase difference and a frequency difference between a reference oscillation and a feedback oscillation;
a loop filter module operably coupled to convert the difference signal into a control signal;
a controlled oscillation module operably coupled to convert the control signal into an output oscillation;
an output oscillation adjust module operably coupled to the controlled oscillation module to produce an effective output oscillation based on an oscillation control signal; and
a divider module operably coupled to convert the effective output oscillation into the feedback oscillation;
wherein the effective output oscillation has a frequency $F_{ep}$ and the output oscillation has a frequency $F_o$ and wherein $F_{eo} >F_o$.

6. The phase locked loop of claim 5 wherein the controlled oscillation module includes a ring oscillator having a plurality of buffer stages and a plurality of taps coupled to a corresponding plurality of outputs of the plurality of buffer stages.

7. The phase locked loop of claim 6 wherein output oscillation adjust module includes an output select block, operably coupled to the plurality of taps, for producing the effective output oscillation from one of the plurality of taps.

8. The phase locked loop of claim 7 wherein the output oscillation adjust module includes a tap adjust control generator, responsive to the oscillation control signal for generating a sequence of tap adjust control signals that command the output select block to select a corresponding sequence of selected taps from the plurality of taps.

9. The phase locked loop of claim 8 wherein the tap adjust control generator includes an integrator having an integrator output, responsive to the oscillation control signal and the reference oscillation, and a modulo(x) module for producing the sequence of tap adjust control signals based on the integrator output.

10. The phase locked loop of claim 9 wherein the value of x is equal to the number of the plurality of taps.

11. The phase locked loop of claim 5 wherein the effective output oscillation has a frequency and the divider module is responsive to the oscillation control signal to produce the feedback oscillation by dividing the frequency of the effective output oscillation by a selected divisor.

12. The phase locked loop of claim 5 wherein the divider module includes a fractional divider.

13. The phase locked loop of claim 11 wherein the selected divisor is an integer.

14. The phase locked loop of claim 5 wherein the effective output oscillation has a frequency $F_{eo}$ and the output oscillation has a frequency $F_o$ and wherein $|F_{eo} - F_o|/F_o < 0.5$.

15. A method for producing an output oscillation, the method comprising the steps of:
   generating a difference signal based on at least one of phase a difference and a frequency difference between a reference oscillation and a feedback oscillation;
   filtering the difference signal to produce a control signal;
   converting the control signal into an output oscillation using a controlled oscillation module;
   adjusting the output oscillation to produce an effective output oscillation based on an oscillation control signal; and
   dividing the effective output oscillation by a selected divisor to produce the feedback oscillation;
   wherein the effective output oscillation has a frequency $F_{eo}$ and the output oscillation has a frequency $F_o$ and wherein $F_{eo} > F_o$.

16. The method of claim 15 wherein the controlled oscillation module includes a ring oscillator having a plurality of buffer stages and a plurality of taps coupled to a corresponding plurality of outputs of the plurality of buffer stages.

17. The method of claim 16 wherein the step of adjusting the output oscillation further comprises, producing the effective output oscillation from one of the plurality of taps.

18. The method of claim 17 wherein the step of adjusting the output oscillation further comprises, selecting a corresponding sequence of selected taps from the plurality of taps based on a sequence of tap adjust control signals.

19. The method of claim 18 wherein the step of adjusting the output oscillation further comprises, generating the sequence, of tap adjust control signal using an integrator having an integrator output, responsive to the oscillation control signal and the reference oscillation, and a modulo(x) module for producing the sequence of tap adjust control signals based on the integrator output.

20. The method of claim 19 wherein the value of x is equal to the number of the plurality of taps.

21. The phase locked loop of claim 18 wherein the divider module includes a fractional divider.

22. The phase locked loop of claim 15 wherein the selected divisor is an integer.

23. The phase locked loop of claim 15 wherein the effective output oscillation has a frequency $F_{eo}$ and the output oscillation has a frequency $F_o$ and wherein $|F_{eo} - F_o|/F_o < 0.5$.

24. A local oscillator for use in a radio receiver for demodulating a radio signal that carries a plurality of audio channels into an audio output signal corresponding to a selected one of the plurality of audio channels, the local oscillator comprising:
   a reference oscillator for producing a reference oscillation;
   a channel selector for generating an oscillation control signal that corresponds to the selected one of the plurality of audio channels;
   a difference detection module operably coupled to determine a difference signal based on at least one of a phase difference and a frequency difference between the reference oscillation and a feedback oscillation;
   a loop filter module operably coupled to convert the difference signal into a control signal;
   a controlled oscillation module operably coupled to convert the control signal into an output oscillation;
   an output oscillation adjust module operably coupled to the controlled oscillation module to produce an effective output oscillation based on an oscillation control signal; and
   a divider module operably coupled to convert the effective output oscillation into the feedback oscillation;
   wherein the effective output oscillation has a frequency and the divider module is responsive to the oscillation control signal to produce the feedback oscillation by dividing the frequency of the effective output oscillation by a selected divisor.

25. The local oscillator of claim 24 wherein the controlled oscillation module includes a ring oscillator having a plurality of buffer stages and a plurality of taps coupled to a corresponding plurality of outputs of the plurality of buffer stages.

26. The local oscillator of claim 25 wherein output oscillation adjust module includes an output select block, operably coupled to the plurality of taps, for producing the effective output oscillation from one of the plurality of taps.

27. The local oscillator of claim 26 wherein the output oscillation adjust module includes a tap adjust control generator, responsive to the oscillation control signal for generating a sequence off tap adjust control signals that command the output select block to select a corresponding sequence of selected taps from the plurality of taps.

28. The local oscillator of claim 27 wherein the tap adjust control generator include an integrator having an integrator output, responsive to the oscillation control signal and the reference oscillation, and a modulo(x) module for producing the sequence of tap adjust control signs based on the integrator output.

29. The local oscillator of claim 28 wherein the value of x is equal to the number of the plurality of taps.

30. The phase locked loop of rim 24 wherein the divider module includes a fractional divider.

31. The phase locked loop of claim 24 wherein the selected divisor is an integer.

32. The local oscillator of claim 24 wherein the effective output oscillation has a frequency $F_{eo}$ and the output oscillation has a frequency $F_o$ and wherein $F_{eo} > F_o$.

33. The local oscillator of claim 24 wherein the effective output oscillation has a frequency $F_{eo}$ and the output oscillation has a frequency $F_o$ and wherein $|F_{eo} - F_o|/F_o < 0.5$.

34. A controlled oscillator comprising:
   a ring oscillator having a plurality of buffer stages and a plurality of tape coupled to a corresponding plurality of outputs of the plurality of buffer stages, the ring oscillator operably coupled to convert a control signal into an output oscillation;
   an output oscillation adjust module operably coupled to the ring oscillator for producing an effective output oscillation based on an oscillation control signal, wherein the output oscillation adjust module includes an output select block, operably coupled to the plurality of taps, for producing the effective output oscillation from a sequence of selected taps from the plurality of taps, and a tap adjust control generator, responsive to the oscillation control signal for generating a sequence of tap adjust control signals that command the output select block to select the sequence of selected taps from the plurality of taps, wherein the tap adjust control generator includes an integrator having an integrator output, responsive to the oscillation control signal and a modulo(x) module for producing the sequence of tap adjust control signals based on the integrator output, wherein the value of x is equal to the number of the plurality of taps.

* * * * *